United States Patent
Uekusa

(10) Patent No.: US 6,927,424 B2
(45) Date of Patent: Aug. 9, 2005

(54) LIGHT EMITTING DIODE AND METHOD FOR PRODUCING IT

(75) Inventor: Hidemoto Uekusa, Narita (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 0 days.

(21) Appl. No.: 10/706,284

(22) Filed: Nov. 13, 2003

(65) Prior Publication Data

US 2004/0144989 A1 Jul. 29, 2004

(30) Foreign Application Priority Data

Nov. 13, 2002 (JP) .................................... P2002-329773

(51) Int. Cl.[7] .............................................. H01L 33/00
(52) U.S. Cl. ............................ 257/99; 257/98; 257/97; 257/99; 257/100; 438/22; 438/23; 438/24; 438/25; 438/26; 313/512; 313/513
(58) Field of Search ............................ 257/92, 98, 99, 257/100, 94, 96, 101, 97; 438/26, 22, 23, 24; 313/512, 513

(56) References Cited

U.S. PATENT DOCUMENTS 6,744,194 B2 * 6/2004 Fukasawa et al. .......... 313/486

2002/0030445 A1 * 3/2002 Fukasawa .................... 313/512

FOREIGN PATENT DOCUMENTS

JP 2002-164583 6/2002

* cited by examiner

Primary Examiner—Nathan J. Flynn
Assistant Examiner—Fazli Erdem
(74) Attorney, Agent, or Firm—Browdy and Neimark, P.L.L.C.

(57) ABSTRACT

A light emitting diode is composed of a generally T-shaped body section (36) and a resin forming section (37) projected on a front surface of the body section (36). The body section (36) has an upright portion (32) inserted into a hole (51) provided in a motherboard (50) and base portions (31a and 31b) which extend from the upright portion and which are mounted on a peripheral edge of the hole (51). The resin forming section (37) includes a non-translucent frame (40) extending from a front surface of the upright portion (32) and an extension part (41) further projecting forwardly larger than the frame. The extension part (41) has a mounted portion (42) mounted on the peripheral edge of the hole (51) of the motherboard (50). Mounted in the concave portion (44) provided in the frame (40) is a light emitting diode element (34), which is sealed by a sealing body (45) of a translucent resin.

12 Claims, 11 Drawing Sheets

LIGHT EMITTING DIODE AND METHOD FOR PRODUCING IT

BACKGROUND OF THE INVENTION

1. Field of the Invention

The present invention relates to a light emitting diode and a method for producing the same, particularly, to a light emitting diode suitable for side luminescence.

2. Description of the Prior Art

Conventionally, a large number of light emitting diodes of surface or plane mounting type have been used for portable phones and the other small electrical instruments, one typical configuration thereof is known in general, as shown in FIG. 9, for example.

The light emitting diode 1 has a structure in which a pair of substrate electrodes 3 and 4 is patterned on an upper surface of a glass epoxy substrate 2, a light emitting diode element 5 is fixed on one electrode 3 by means of a conductive adhesive (not shown) and an upper electrode 5a of the light emitting diode element 5 and the other electrode 4 are connected by a bonding wire 6, and the light emitting diode element 5 is sealed by a sealing body 7 formed from a transparent epoxy resin.

The aforementioned light emitting diode 1 is generally mounted on a surface of a motherboard 8 (see FIG. 10) and is often formed to emit light upward.

In recent, the light emitting diode is often used as a light source of a backlight for illuminating a screen of a liquid crystal display of a portable phone, for example.

In this case, the light emitting diode 1 is inserted into a hole 9 provided in the motherboard 8, from a side of a back surface of the motherboard and then the substrate electrodes 3 and 4 of the light emitting diode 1 are fixed on a print wiring 10 provided on the back surface of the motherboard 8 by a solder 11 to reflect perpendicularly light emitted upwardly from the light emitting diode 1 on a inclined end surface 14 of an optical wave-guide 13 which is disposed above of the motherboard 8 and to guide the reflected light into the optical wave-guide 13.

However, in such a method as to use the reflected light, there is a possibility of generating a loss of light, and further it is necessary to carry out a micro-adjustment of an reflected angle of light illuminated from the light emitting diode element 5 and an angle of the inclined end surface 14, because the optical wave-guide 13 is thinned.

Under the circumstances, the Applicant in the present application has proposed a light emitting diode of a generally T-character shape as shown in FIG. 11, as a light emitting diode of a side luminescence type to coincide an illuminated direction of light from the light emitting diode with an entered direction of light into the optical wave-guide (see Japanese Patent Laid-Open No. 2002-164583).

The light emitting diode 15 includes a upright section 17, base sections 16a and 16b extending rightward and leftward from the upright section 17, and a protrusion 18 projecting from a front surface of the upright section 17. The protrusion 18 is formed with a concave portion in which a light emitting diode element 19 is disposed.

The light emitting diode element 19 is sealed by a sealing body 20 which is formed by a transparent resin filled into the concave portion.

The light emitting diode 15 structured as described above is mounted on the motherboard 8 in such a manner that the light emitting diode 15 is inserted into the hole 9 of the mother board 8 from the back surface of the motherboard 8 and then upper surfaces of the base sections 16a and 16b are disposed upon the motherboard at two positions on a peripheral edge of the hole 9 in order to fix substrate electrodes 21a and 21b of the base sections 16a and 16b to a print wiring of the motherboard 8 by soldering and to conduct electrically them.

The light emitting diode having the structure as described above has advantageous effects that it is possible to illuminate an incident surface or side surface of the optical wave-guide 13 on the side of the surface of the motherboard 8 and to enter directly the light emitted horizontally from the light emitting diode element 19 in the side of the optical wave-guide 13.

However, because the aforementioned T-shaped light emitting diode 15 has such a structure that the protrusion 18 is formed on the front surface of the upright section 17, there is a problem that a center of gravity of the light emitting diode offsets forwardly and therefore an unbalance for inclining the light emitting diode generates when the base sections 16a and 16b are mounted on the peripheral edge of the hole 9 provided in the motherboard 8.

SUMMARY OF THE INVENTION

It is, therefore, a first object of the present invention to provide a light emitting diode in which the light emitting diode can be supported with at least three points when it is mounted on a peripheral edge of a hole in a motherboard to carry out stability of a posture of the light emitting diode.

It is a second object of the present invention to provide a method for producing a light emitting diode by a simple process.

To achieve the above first object, the light emitting diode according to the present invention comprises a generally T-shaped body section including base portions having mounted surfaces mounted on peripheral edges of a hole opened in a motherboard and an upright portion which rises from the base portions and which is inserted into the hole; a resin forming section including a non-translucent frame projecting from a front surface of the body section and an extension part which projects more forwardly than the frame from the body section and which has a mounted portion mounted on a peripheral edge of the hole of the motherboard; a light emitting diode element mounted in a concave portion provided in the frame; and a translucent resin body formed in the concave portion of the frame to seal the light emitting diode element.

In one embodiment, the resin forming section is formed integrally with the body section by a transfer forming.

The mounted portion of the extension part is set to position in the same level as the mounted surfaces of the base portions, and a suction portion is provided on a back surface of the mounted portion.

The frame is provided with two mutually perpendicular light emitting parts.

In an embodiment, the frame is formed from a non-translucent resin of white color system.

The body section is provided with a pair of substrate electrodes with which the light emitting diode is electrically connected.

To achieve the above second object, the method for manufacturing the light emitting diode according to the present invention comprises the steps of projecting and forming a resin forming section having a frame, on a front surface of a body section having a upright portion and base portions by a transfer forming, providing a concave portion in the frame of the resin forming section, disposing a light emitting diode element within the concave portion, and filling a translucent resin in the concave portion to seal the light emitting diode.

According to this method for manufacturing, the resin forming section can be easily formed through the transfer forming and the position of the light emitting diode element can be determined by means of the frame of the transfer forming.

DETAILED DESCRIPTION OF THE PREFERRED EMBODIMENTS

Several embodiments of the present invention will be explained with reference to the accompanying drawings below.

Figure 1:
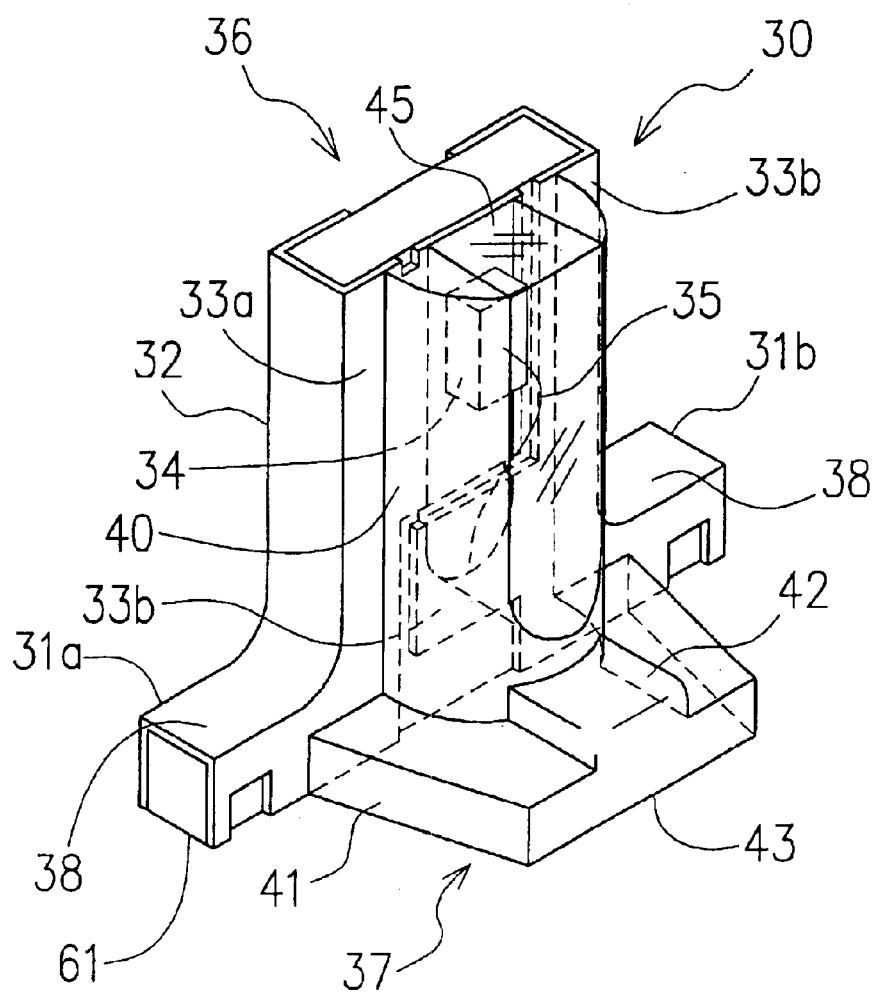
FIG. 1 is a perspective view showing an outside shape of a completed light emitting diode according to the present invention.
Figure 2:
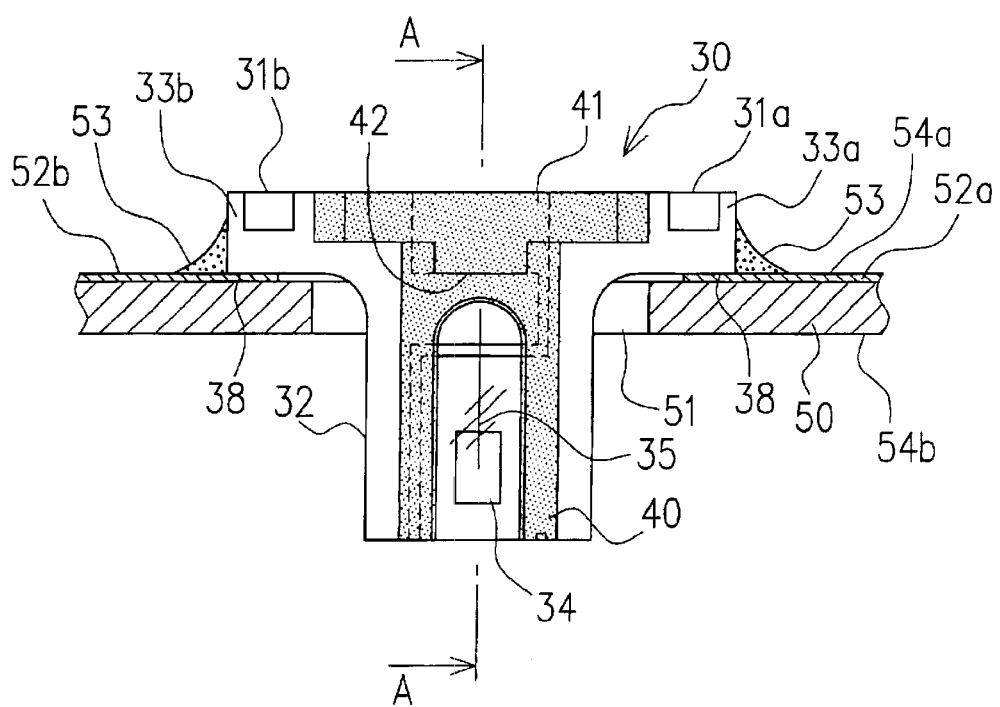
FIG. 2 is a front view showing a state that the light emitting diode is mounted on a motherboard.
Figure 3:
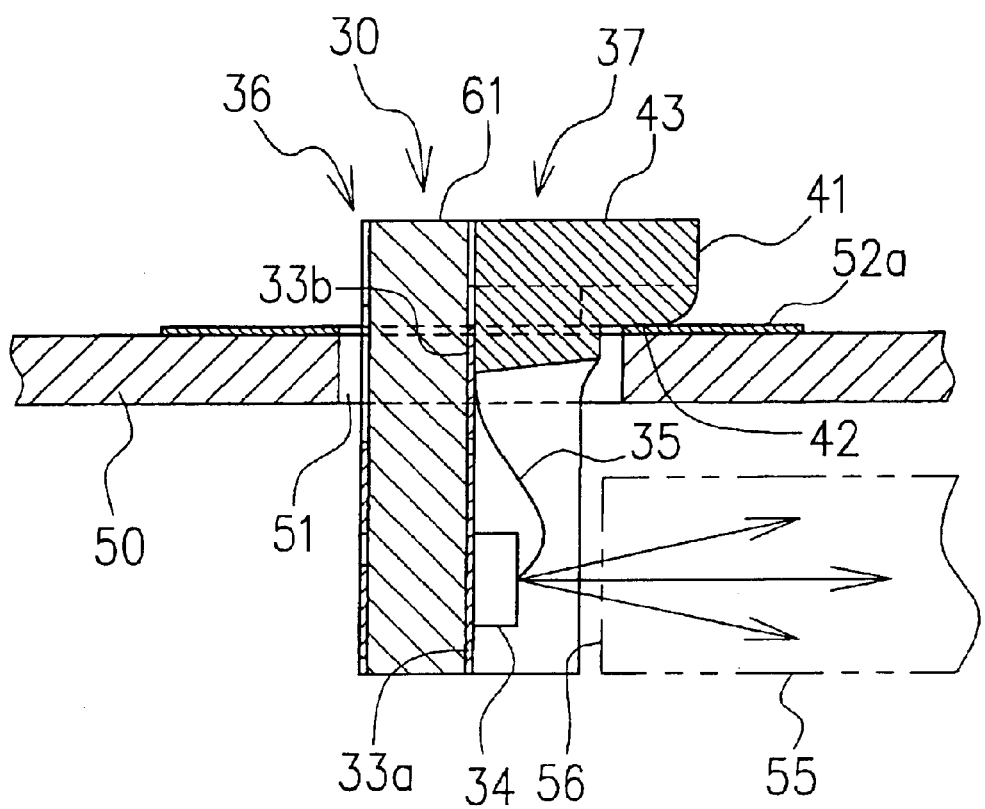
FIG. 3 is a sectional view taken along A—A line in FIG. 2.
Figure 4:
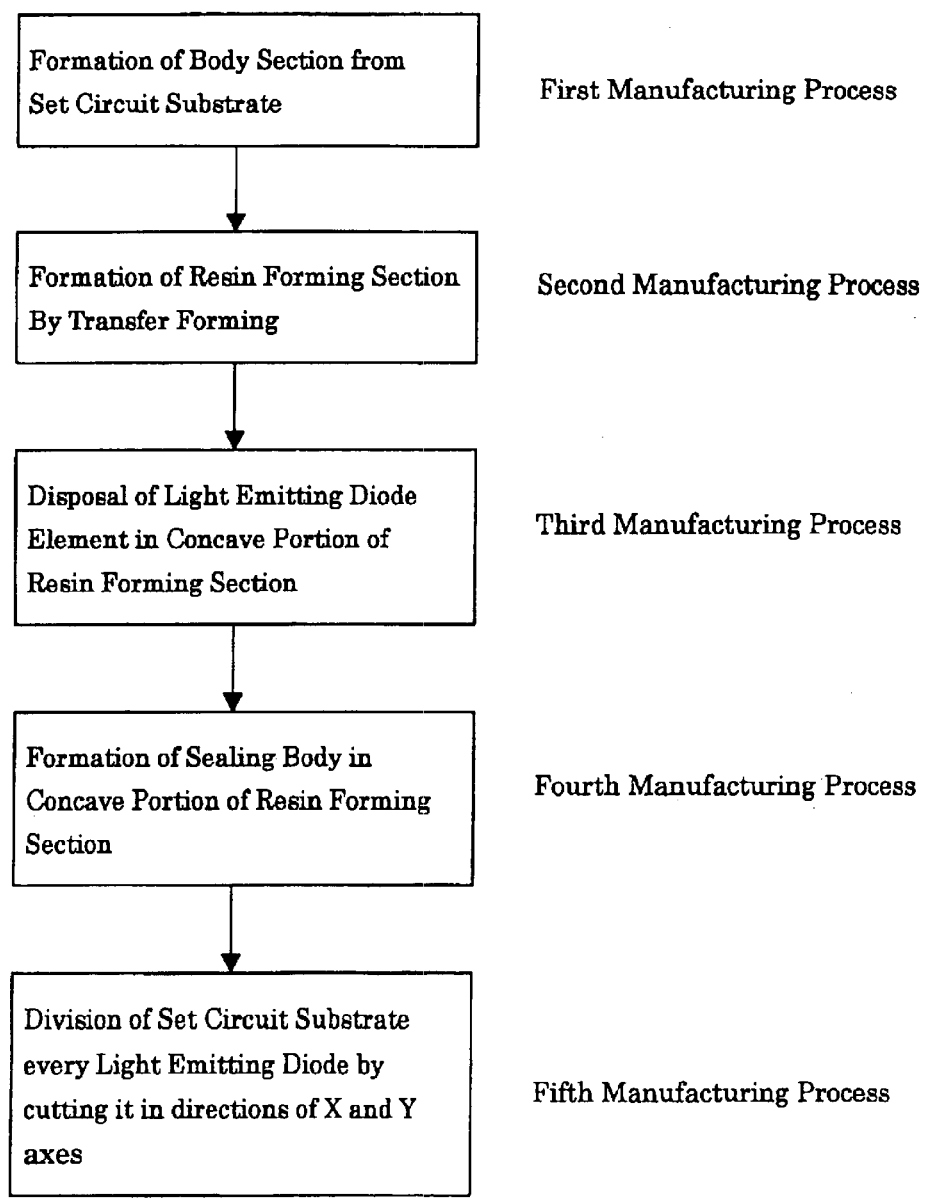
FIG. 4 is a block view showing processes for producing the light emitting diode.

Alight emitting diode 30 according to an embodiment as shown in FIGS. 1 to 3 comprises a body section 36 formed into a generally T-character shape from a glass epoxy resin material and a resin forming section 37 extending integrally from, for example, a front surface of the body section through a transfer forming.

Figure 5:
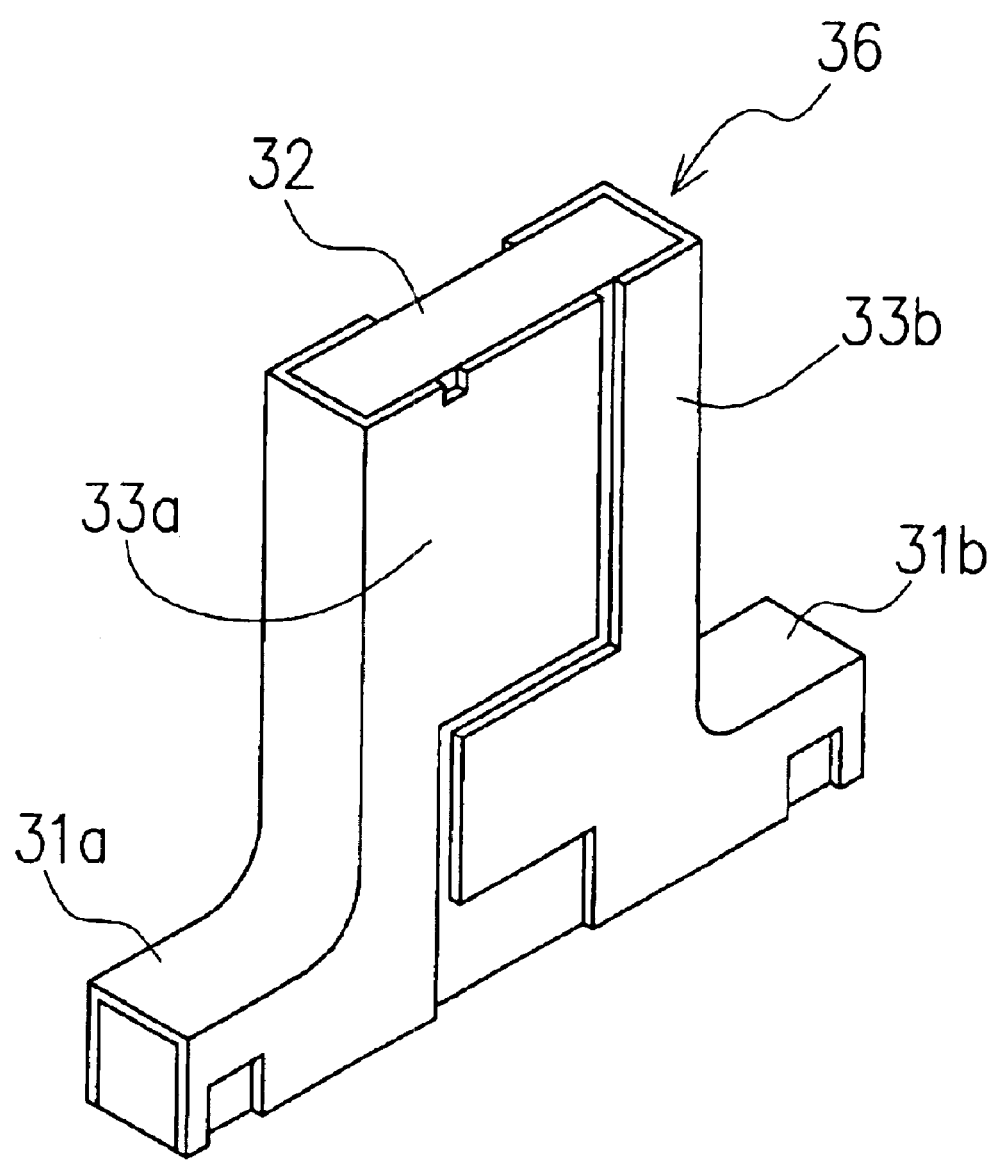
FIG. 5 is a perspective view showing a light emitting diode formed in a first manufacturing process.

The body section 36 includes an upright portion 32 extending upwardly and base portions 31a and 31b extending rightward and leftward from opposite sides of the upright portion 32 at a lower end thereof. A pair of right and left substrate electrodes 33a and 33b is provided on surfaces of the base portions 31a and 31b and upright portion 32, as shown in FIG. 5. The base portions 31a and 31b have at upper surfaces thereof (as viewed in FIG. 1) mounted surfaces 38 which are mounted on a peripheral edge of a hole provided in a motherboard as described below. A light emitting diode element 34 is fixed on one substrate electrode 33a, for example, in a front surface of the upright section 32. For example, the light emitting diode element 34 has a three-dimensional rectangular shape. An end of a bonding wire 35 extending from the light emitting diode element 34 is connected with the other substrate electrode 33b by any means (see FIGS. 1 to 3).

On the other hand, the resin forming section 37 is composed of a generally U-shaped frame 40 formed on the front surface of the upright section 32 and a plate-shaped extension part 41 which is formed integrally with the frame 40 at a lower end thereof and which extends forwardly larger than the frame from the base portions 31a and 31b at an approximate center part thereof.

The extension part 41 has a generally trapezoidal shape and is formed at the center of an upper surface thereof with a rectangular mounted portion 42 projecting from the extension part 41. It should be noted that an upper surface of the mounted portion 42 is positioned to become the same level as the upper surfaces or mounted surfaces 38 of the base portions 31a and 31b. In this embodiment, a back surface 43 of the extension part 41 is formed into a large flat suction surface flush with back surfaces 61 of the base portions 31a and 31b to facilitate a suction transport in transferring the light emitting diode 30.

On the other hand, the aforementioned frame 40 having a semi-circular cylindrical shape is formed with an elongate concave portion 44 disposed on a central portion of the frame for inserting the light emitting diode element 34. An upper end of the concave portion 44 is opened and a bottom end of the concave portion 44 is formed into a curved shape.

It should be noted that the concave portion is formed so as to expose a portion of the one substrate electrode 33a. As a result, when the light emitting diode element 34 is inserted into the concave portion 44, it can be mounted easily on the exposed substrate electrode 33a. The insertion of the light emitting diode element 34 into the concave portion 44 is carried out after the resin forming section 37 is formed through the transfer forming.

Thereafter, a sealing body 45 is formed in the concave portion 44 of the frame 40 by filling a liquid translucent material of epoxy system into the concave portion and hardening it. Because the frame 40 is, first, formed by the transfer forming and then the light emitting diode element 34 is disposed in the concave portion 44, it is possible to use the frame 40 to position the light emitting diode element 34 when arranging it into the concave portion 44.

As shown in FIG. 1, when the light emitting diode element 34 is disposed in the concave portion 44, both side and lower surfaces of the light emitting diode element 34 are shielded by means of the frame 40 and only front and upper surfaces of the light emitting diode element are not shielded by means of the frame 40. Consequently, it is possible to emit intensively light from the front and upper surfaces of the light emitting diode element in forward and upward directions of the light emitting diode 30.

In addition, it is desirable to use a non-transparent resin of white color system as the forming material of the resin forming section 37 having the frame 40 and extension part 41 because it can reflect effectively the light from the light emitting diode element 34, thus obtaining a high efficiency of irradiation of light in the forward direction of the light emitting diode.

FIGS. 2 and 3 illustrate a state of mounting the light emitting diode 30 structured as described above on a motherboard 50. The motherboard 50 is provided with a circular hole 51 for mounting the light emitting diode 30 thereon. The upright portion 32 is, first, inserted in the hole 51 and the mounted surfaces 38 of the base portions 31a and 31b are, then, mounted on a peripheral edge of the hole 51 and at the same time, the mounted portion 42 is mounted on the peripheral edge of the hole 51 to support the light emitting diode with three points of the mounted surfaces 38 and mounted portion 42.

As a result, the light emitting diode 30 can be mounted correctly and firmly on the motherboard 50. On that basis, the substrate electrodes 33a and 33b on the base portions 31a and 31b and circuit electrodes 52a and 52b print-wired on the motherboard 50 are fixed by means of a solder 53 to secure firmly the light emitting diode 30 on the motherboard 50.

Note that the attachment the light emitting diode 30 on the motherboard 50 may, also, be carried out in such a state that they are upside down.

At this time, the upright portion 32 and frame 40 of the light emitting diode 30 extend passing through the hole 51 from a back surface 54a to a front surface 54b of the motherboard 50. The front surface 54b of the light emitting diode element 34 disposed in the upright portion 32 is positioned to face a forward direction of the light emitting diode 30 or an optical wave-guide 55 which is shown by chained lines in FIG. 3 and which is disposed in the front direction of the light emitting diode 30 (see FIG. 3).

Because the both side and lower surfaces of the light emitting diode element 34 are shielded by the frame 40, the light from the light emitting diode element 34 is shielded so that diffusion of light to the both sideward and downward directions of the light emitting diode is blocked. Accordingly, when the principle of the light emitting diode is used as a light source of the optical wave-guide 55 in a backlight of a liquid crystal, the light emitted from the light emitting diode element 34 is directed toward a guiding end surface 56 and entered directly therein and then goes straightly in the optical wave-guide 55, as shown in FIG. 3.

In this case, it is possible to illuminate more brightly the optical wave-guide 55, because an amount of light of entering into the optical wave-guide 55 is increased by an operation of blocking light diffusion by the frame 40 surrounding the light emitting diode element 34.

Subsequently, a method for manufacturing the light emitting diode 30 of the above structure will be explained with reference to FIGS. 4 to 8 below.

Figure 8:
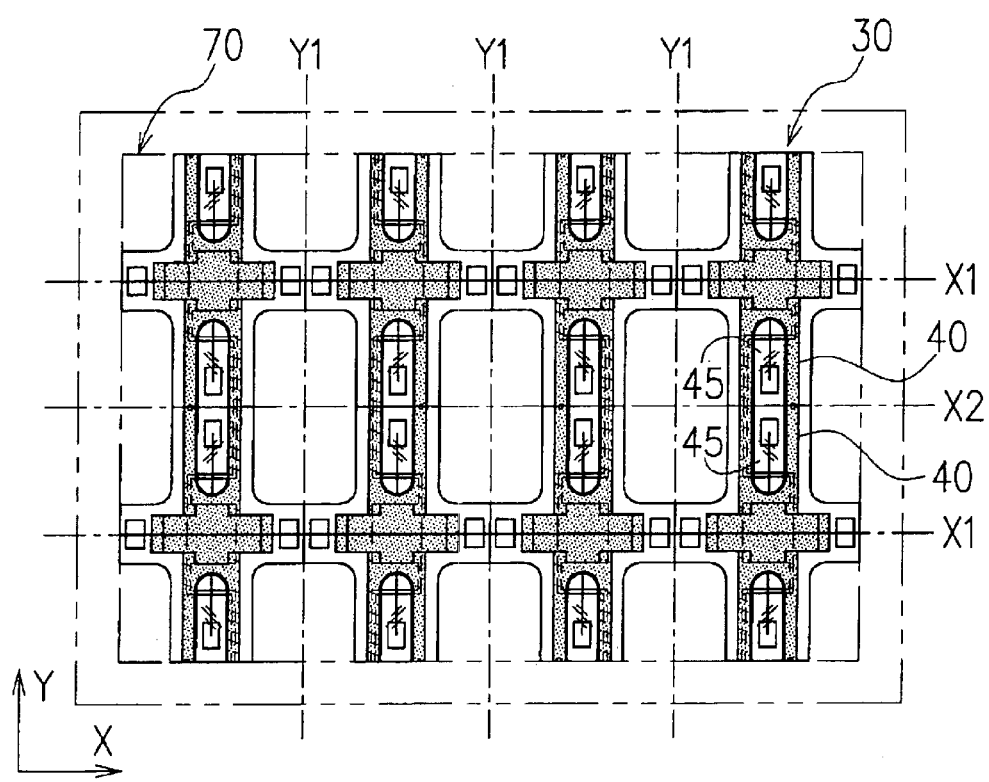
FIG. 8 is a top plane view showing a light emitting diode formed on a collective circuit board in a fourth manufacturing process.
Figure 9:
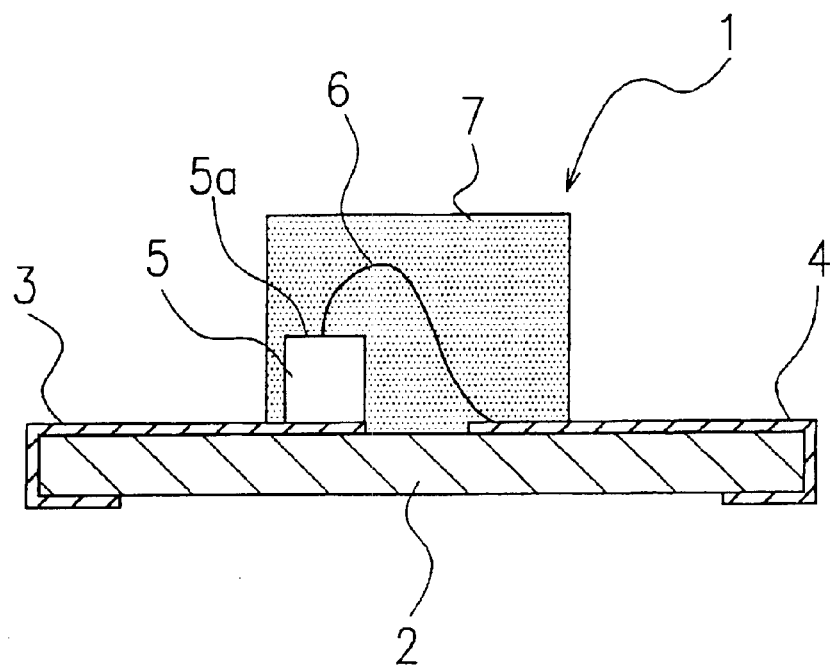
FIG. 9 is a sectional view showing of one example of a conventional light emitting diode.
Figure 10:
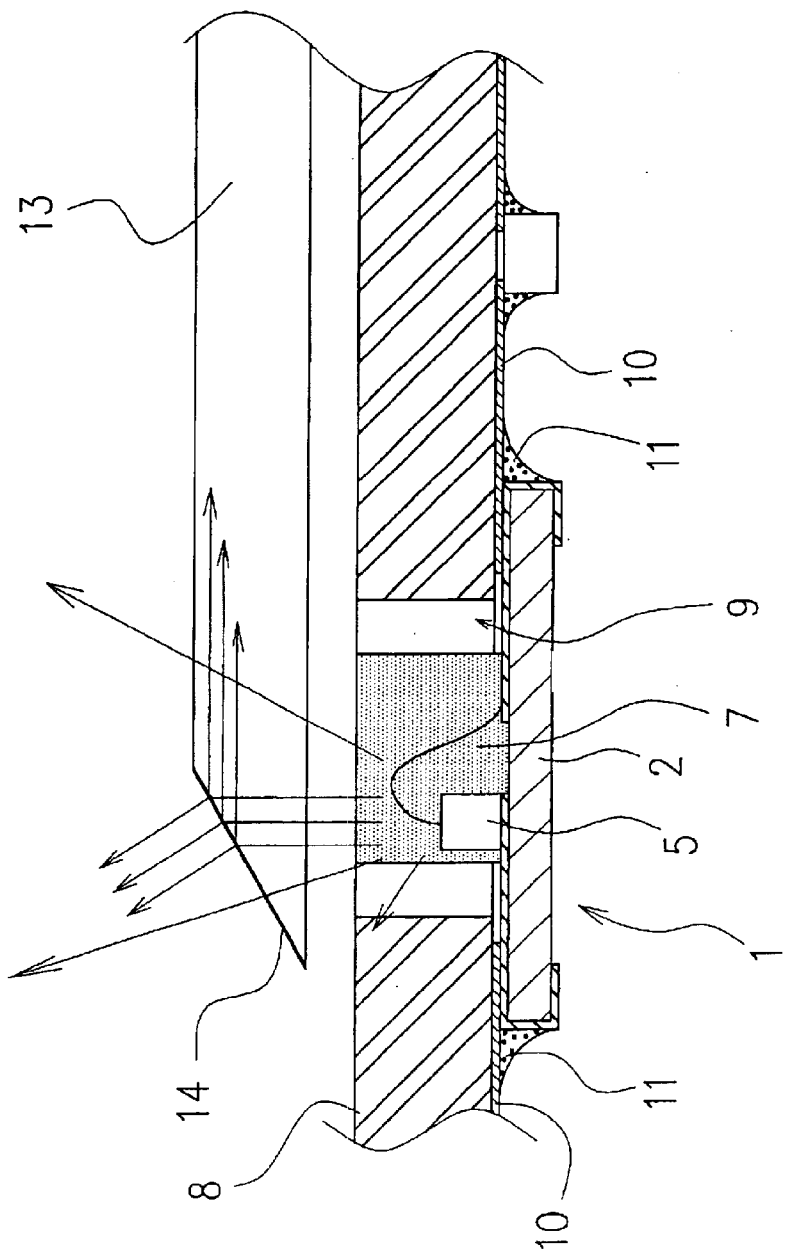
FIG. 10 is a sectional view showing a state that the conventional light emitting diode is mounted on a motherboard.
Figure 11:
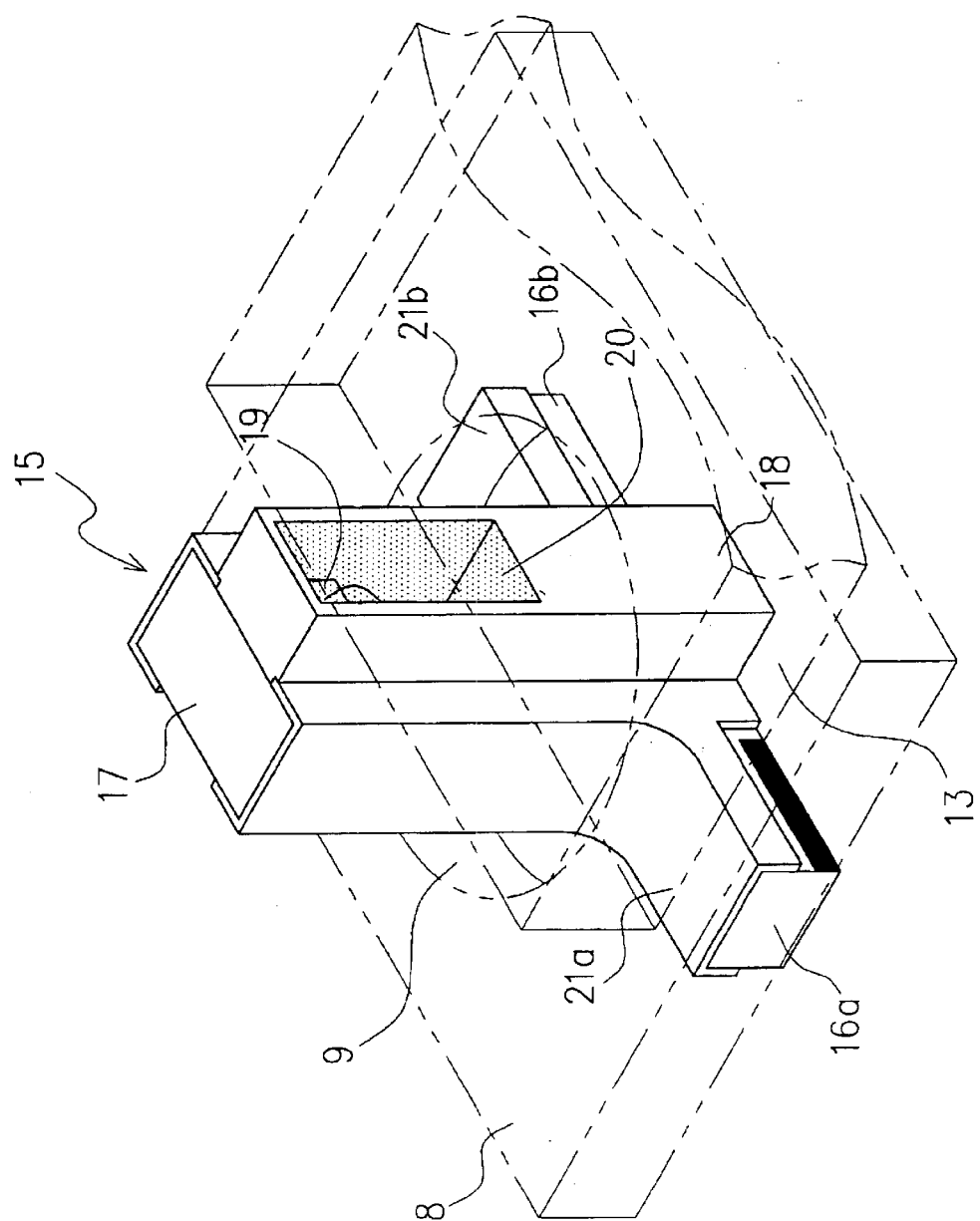
FIG. 11 is a perspective view showing one example of a conventional T-shaped light emitting diode.

The body section 36 is, first, formed as shown in FIG. 5. As a means for forming the body section, for example, a method for producing simultaneously a large number of body sections 36 having the same shape from one collective circuit board 70 is often adopted, as shown in FIG. 8. Used for the collective circuit board 70 is an epoxy substrate on whose surface a thin copper plate is provided. The base portions 31a and 31b and the upright portion 32 are formed into a T-character shape on the epoxy substrate, and thereafter the pair of substrate electrodes 33a and 33b, a through hole (not shown) and so on are formed by means of etching and deposition (first manufacturing process).

Figure 6:
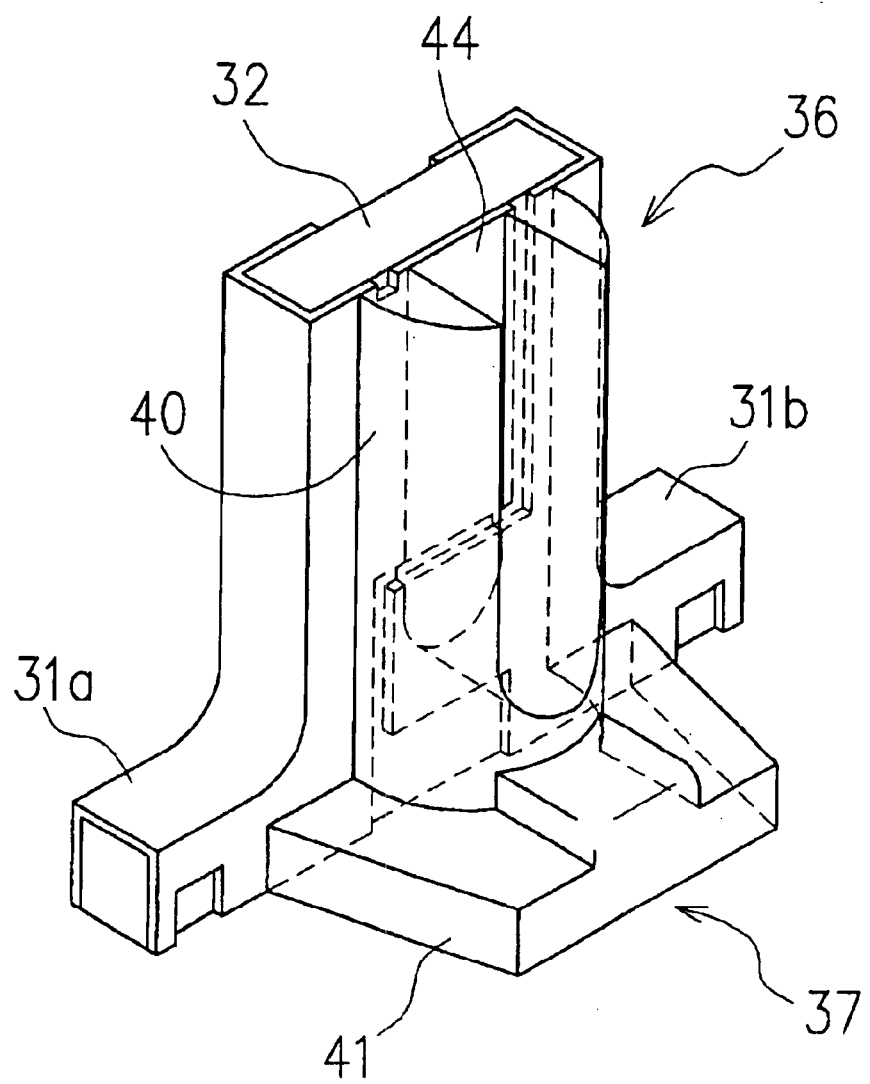
FIG. 6 is a perspective view showing a light emitting diode formed in a second manufacturing process.

Next, a die is disposed on the collective circuit board 70 on which the body section 36 is formed to form a resin forming section 37 through transfer forming (second manufacturing process). The resin forming section 37 is composed of a frame 40 projecting on a front surface of the upright portion 32 as shown in FIG. 6 and an extension part 41 projecting on a front surface of the base portions 31a and 31b. In the process, a concave portion 44 is, also, formed in a front surface of the frame 40 to expose a portion of at least one substrate electrode 33a to mount the light emitting diode element 34, as shown in FIG. 6.

Figure 7:
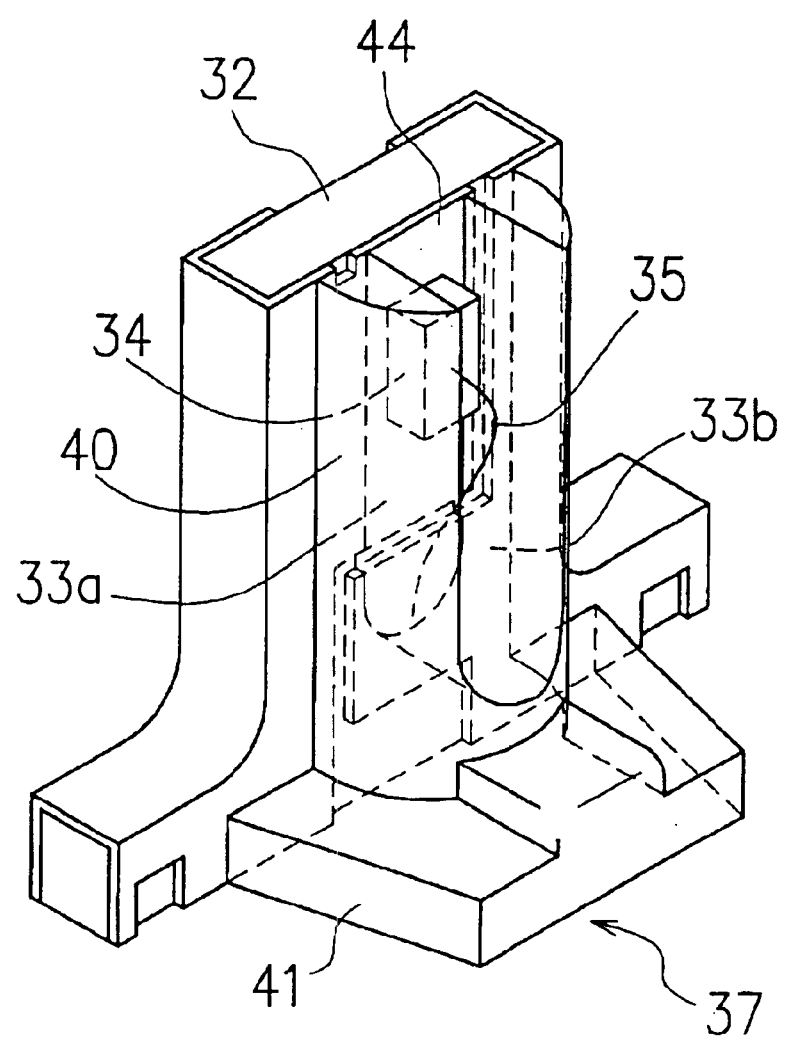
FIG. 7 is a perspective view showing a light emitting diode formed in a third manufacturing process.

In the next process, as shown in FIG. 7, the light emitting diode element 34 is disposed in the concave portion 44 to fix a bottom surface thereof on the one substrate electrode 33a by adhering and then an end or leading end of a bonding wire 35 extending from an upper surface of the light emitting diode element 34 is adhered to the other substrate electrode 33b to conduct electrically them (third manufacturing process).

Subsequently, as shown in FIG. 1, the sealing body 45 is formed by fill-up of a liquid achromatic transparent epoxy resin into the concave portion 44 of the frame 40 to seal the light emitting diode element 34 and bonding wire 35. The filled epoxy resin is hardened through a hardening process (fourth manufacturing process).

FIG. 8 illustrates a large number of light emitting diodes 30 arranged and formed on the collective circuit board through the aforementioned manufacturing processes. In the final, fifth manufacturing process, the collective circuit board is divided every a completed single light emitting diode 30 as shown in FIG. 1, by it being cut along cutting lines X1 and X2 in a direction of X axis and along a cutting line Y in a direction of Y axis. As shown in FIG. 8, because two light emitting diodes 30 in the direction of Y axis are formed on the collective circuit board to face with respect to each other, it is possible to form simultaneously the sealing bodies 45 of the two light emitting diodes 30 by filling the liquid transparent resin into the concave portion 44 of the frame 40 (shown in FIG. 7) once. As a result, when the frame is divided into two along the cutting line X2, the transparent resin is exposed at an upper end of each frame 40.

In addition, although the above embodiment has been described with respect to the case of using the light emitting diode 30 as the light source of the optical wave-guide 55 of the backlight in the liquid crystal, the light emitting diode 30 may be used for the other case, for example, as an indicator for a portable phone, PDA (Personal Digital Assistance) or the like.

As described above, according to the light emitting diode, because the light emitting diode can be supported with at least three points of the mounted surfaces in the base portions and mounted portion of the extension part on the peripheral edge of the hole provided in the motherboard, it is possible to accomplish stability of the light emitting diode at the time of mounting on the motherboard and a high level of performance of soldering.

According to the method for manufacturing the light emitting diode in the present invention, because the frame is formed on the front surface of the body section having the base portions and upright portion by the transfer forming, the light emitting diode element is disposed in the concave portion provided in the frame and then the light emitting diode element is sealed by filling the translucent resin in the concave portion, it is possible to simplify the manufacturing processes of the light emitting diode and to use the frame formed by the transfer forming in positioning the light emitting diode element in the frame.

Moreover, because it is possible to make a large number of light emitting diodes of the same shape from one collective circuit board in the manufacturing method, minimization of a manufacturing cost can be achieved.

What is claimed is:

1. A light emitting diode comprising: a generally T-shaped body section including base portions having mounted surfaces for being mounted on a peripheral edge of a hole opened in a motherboard and an upright portion raised from said base portions for being inserted into said hole;

a resin forming section including a non-translucent frame projecting from a surface of said body section and an extension part which projects from said body section to project more forwardly than the frame and which has a mounted portion for being mounted on the peripheral edge of the hole of the motherboard;

a light emitting diode element mounted in a concave portion provided in said frame; and a translucent sealing formed in said concave portion of the frame to seal said light emitting diode element, wherein said resin forming section is formed integrally with said body section by a transfer forming.

2. A light emitting diode comprising: a generally T-shaped body section including base portions having mounted surfaces for being mounted on a peripheral edge of a hole opened in a motherboard and an upright portion raised from said base portions for being inserted into said hole;

a resin forming section including a non-translucent frame projecting from a surface of said body section and an extension part which projects from said body section to project more forwardly than the frame and which has a mounted portion for being mounted on the peripheral edge of the hole of the motherboard;

a light emitting diode element mounted in a concave portion provided in said frame; and a translucent sealing formed in said concave portion of the frame to seal said light emitting diode element, wherein said mounted portion of the extension part is positioned to become the same level as the mounted surfaces of the base portions, and a suction portion is provided on a back surface of the mounted portion.

3. A light emitting diode comprising: a generally T-shaped body section including base portions having mounted surfaces for being mounted on a peripheral edge of a hole opened in a motherboard and an upright portion raised from said base portions for being inserted into said hole;

a resin forming section including a non-translucent frame projecting from a surface of said body section and an extension part which projects from said body section to project more forwardly than the frame and which has a mounted portion for being mounted on the peripheral edge of the hole of the motherboard;

a light emitting diode element mounted in a concave portion provided in said frame; and a translucent sealing formed in said concave portion of the frame to seal said light emitting diode element, wherein said frame is provided with two mutually perpendicular light emitting planes.

4. A light emitting diode comprising: a generally T-shaped body section including base portions having mounted surfaces for being mounted on a peripheral edge of a hole opened in a motherboard and an upright portion raised from said base portions for being inserted into said hole;

a resin forming section including a non-translucent frame projecting from a surface of said body section and an extension part which projects from said body section to project more forwardly than the frame and which has a mounted portion for being mounted on the peripheral edge of the hole of the motherboard;

a light emitting diode element mounted in a concave portion provided in said frame; and a translucent sealing formed in said concave portion of the frame to seal said light emitting diode element, wherein said frame is formed from a non-translucent resin of white color system.

5. A light emitting diode comprising: a generally T-shaped body section including base portions having mounted surfaces for being mounted on a peripheral edge of a hole opened in a motherboard and an upright portion raised from said base portions for being inserted into said hole;

a resin forming section including a non-translucent frame projecting from a surface of said body section and an extension part which projects from said body section to project more forwardly than the frame and which has a mounted portion for being mounted on the peripheral edge of the hole of the motherboard;

a light emitting diode element mounted in a concave portion provided in said frame; and a translucent sealing formed in said concave portion of the frame to seal said light emitting diode element, wherein said body section is provided with a pair of substrate electrodes with which said light emitting diode is electrically connected.

6. The light emitting diode according to claim 1, wherein said body section is provided with a pair of substrate electrodes with which said light emitting diode is electrically connected.

7. The light emitting diode according to claim 2, wherein said body section is provided with a pair of substrate electrodes with which said light emitting diode is electrically connected.

8. The light emitting diode according to claim 4, wherein said body section is provided with a pair of substrate electrodes with which said light emitting diode is electrically connected.

9. The light emitting diode according to claim 1, wherein said frame is provided with two mutually perpendicular light emitting planes.

10. The light emitting diode according to claim 6, wherein said frame is provided with two mutually perpendicular light emitting planes.

11. The light emitting diode according to claim 7, wherein said frame is provided with two mutually perpendicular light emitting planes.

12. The light emitting diode according to claim 8, wherein said frame is provided with two mutually perpendicular light emitting planes.

* * * * *